(12) United States Patent
Jau et al.

(10) Patent No.: US 10,566,030 B2
(45) Date of Patent: *Feb. 18, 2020

(54) HARD DRIVE CARRIER

(71) Applicant: QUANTA COMPUTER INC., Taoyuan (TW)

(72) Inventors: Maw-Zan Jau, Taoyuan (TW); Chao-Jung Chen, Taoyuan (TW); Chih-Ming Chen, Taoyuan (TW); Wei-Cheng Tseng, Taoyuan (TW)

(73) Assignee: QUANTA COMPUTER INC., Taoyuan (TW)

( * ) Notice: Subject to any disclaimer, the term of this patent is extended or adjusted under 35 U.S.C. 154(b) by 0 days.

This patent is subject to a terminal disclaimer.

(21) Appl. No.: 15/911,983

(22) Filed: Mar. 5, 2018

(65) Prior Publication Data
US 2018/0197598 A1 Jul. 12, 2018
US 2020/0020385 A9 Jan. 16, 2020

Related U.S. Application Data

(62) Division of application No. 14/598,267, filed on Jan. 16, 2015, now Pat. No. 9,911,464.

(30) Foreign Application Priority Data

Jan. 16, 2014 (TW) .............................. 103101640 A

(51) Int. Cl.
*G11B 33/00* (2006.01)
*H05K 7/18* (2006.01)
(Continued)

(52) U.S. Cl.
CPC ............ *G11B 33/124* (2013.01); *G06F 1/187* (2013.01); *H05K 7/18* (2013.01)

(58) Field of Classification Search
CPC ..... G11B 33/124; G11B 33/123; G06F 1/187; H05K 7/18
(Continued)

(56) References Cited

U.S. PATENT DOCUMENTS 4,426,122 A * 1/1984 Lainez ................. A62B 18/082
361/679.55
5,034,824 A * 7/1991 Morisawa ............ G11B 17/046
348/373
(Continued)

FOREIGN PATENT DOCUMENTS

CN 102053652 A 5/2011
CN 102245001 A 11/2011
(Continued)

OTHER PUBLICATIONS

Office Action in U.S. Appl. No. 14/598,267, dated Oct. 6, 2016.
(Continued)

*Primary Examiner* — Michael Safavi
(74) *Attorney, Agent, or Firm* — Nixon Peabody LLP; Zhou Lu

(57) ABSTRACT

In some implementations, a hard drive carrier is configured to couple and decouple a hard drive to/from a chassis (e.g., motherboard). The hard drive carrier can receive and house a hard drive in a base securing portion, the base securing portion adapted to slide and tilt in relation to a base of the hard drive carrier. The hard drive carrier can include a pivoting lever comprising a handle that can be used to couple and decouple the hard drive from the motherboard. Using the handle to pivot the lever into an open position causes the hard drive to tilt upwards to decouple from the chassis and facilitate insertion or removal of the hard drive
(Continued)

to/from the hard drive carrier. Pivoting the lever into a closed position causes the hard drive to lie flat and couple to the chassis.

8 Claims, 6 Drawing Sheets

(51) Int. Cl.
*G11B 33/12* (2006.01)
*G06F 1/18* (2006.01)

(58) Field of Classification Search
USPC .......... 361/679.38, 679.39, 679.31; 720/612, 720/613, 609
See application file for complete search history.

(56) References Cited

U.S. PATENT DOCUMENTS

| | | | |
|---|---|---|---|
| 5,588,728 A | 12/1996 | Eldridge et al. | |
| 5,641,296 A | 6/1997 | Larabell et al. | |
| 6,122,165 A | 9/2000 | Schmitt et al. | |
| 6,178,149 B1* | 1/2001 | Nakamura | G11B 17/054 |
| | | | 360/99.06 |
| 6,625,014 B1 | 9/2003 | Tucker et al. | |
| 6,798,600 B2* | 9/2004 | Yoshimura | G11B 17/0436 |
| | | | 360/69 |
| 7,012,803 B1 | 3/2006 | Austin et al. | |
| 7,771,218 B2 | 8/2010 | Jaramillo et al. | |
| 8,064,312 B2* | 11/2011 | Ishihara | G11B 33/123 |
| | | | 369/75.11 |
| 8,498,109 B2* | 7/2013 | Nishimoto | G11B 33/123 |
| | | | 361/679.01 |
| 9,122,458 B2 | 9/2015 | Yu | |
| 9,230,606 B2 | 1/2016 | Ding et al. | |
| 9,462,719 B2 | 10/2016 | Wu et al. | |
| 2006/0171109 A1 | 8/2006 | Chang | |
| 2006/0171110 A1 | 8/2006 | Li | |
| 2008/0128579 A1 | 6/2008 | Chen et al. | |
| 2008/0137281 A1 | 6/2008 | Chen et al. | |
| 2009/0122681 A1* | 5/2009 | Ishihara | G11B 25/043 |
| | | | 369/75.11 |
| 2010/0097912 A1 | 4/2010 | Lin | |
| 2013/0070422 A1* | 3/2013 | Dunham | G06F 1/187 |
| | | | 361/725 |
| 2013/0188300 A1* | 7/2013 | Schrock | G11B 33/124 |
| | | | 361/679.01 |
| 2015/0271943 A1* | 9/2015 | Peng | G11B 33/128 |
| | | | 361/679.39 |
| 2015/0327414 A1* | 11/2015 | Jau | H05K 13/0084 |
| | | | 206/701 |
| 2016/0054767 A1* | 2/2016 | Chen | G06F 1/1658 |
| | | | 361/679.39 |

FOREIGN PATENT DOCUMENTS

| | | |
|---|---|---|
| CN | 202268168 U | 6/2012 |
| CN | 102781194 A | 11/2012 |
| WO | WO 2010/147593 A1 | 12/2010 |

OTHER PUBLICATIONS

Office Action in U.S. Appl. No. 14/598,267, dated Jul. 22, 2016.
Office Action in U.S. Appl. No. 14/598,267, dated Feb. 9, 2016.
Office Action in U.S. Appl. No. 14/598,267, dated May 8, 2017.
Notice of Allowance in U.S. Appl. No. 14/598,267, dated Oct. 5, 2017.

* cited by examiner

HARD DRIVE CARRIER

CROSS-REFERENCE TO RELATED APPLICATIONS

The application is a divisional application of U.S. Non-Provisional application Ser. No. 14/598,267, filed Jan. 16, 2015 and which claims priority to, and the benefit of, Taiwanese Patent Application No. 103 101 640, filed Jan. 16, 2014. The contents of all of the foregoing are herein incorporated by reference in their entirety.

TECHNICAL FIELD

The disclosure generally relates to a hard drive carrier that facilitates insertion and removal of a hard drive to/from a chassis.

BACKGROUND

Conventionally, a network comprises a plurality of racks, each rack housing a plurality of servers. A server chassis typically houses a motherboard, memory, and networking interfaces. Some server chassis are designed to house a plurality of hard drives. In the event of hard drive failure, the hard drives need to be replaced. However, in a system requiring many hard drives, such as a server network, inserting and removing multiple hard drives can become cumbersome.

SUMMARY

In some implementations, a hard drive carrier can be configured to couple and decouple a hard drive to/from a chassis (e.g., motherboard). The hard drive carrier can receive and house a hard drive in a base securing portion, the base securing portion adapted to slide and tilt in relation to a base of the hard drive carrier. The hard drive carrier can include a pivoting lever comprising a handle that can be used to couple and decouple the hard drive from the motherboard. Using the handle to pivot the lever into an open position causes the hard drive to tilt upwards to decouple from the chassis and facilitate insertion or removal of the hard drive to/from the hard drive carrier. Pivoting the lever into a closed position causes the hard drive to lie flat and couple to the chassis.

In some implementations, the hard drive carrier comprises a removable portion. For example, the removable portion can be adapted to house the hard drive. The removable portion can comprise a lever. Pivoting the lever into an open position causes the hard drive to decouple from the chassis and allows removal of the hard drive from the chassis by lifting the removable portion out of the frame. The hard drive can be coupled to the chassis by inserting the removable portion into the frame and pivoting the lever into a closed position.

Particular implementations provide at least the following advantages: a hard drive can be coupled and decoupled to/from a chassis by pivoting a lever up or down, allowing for easy insertion and removal of the hard drive to/from the chassis.

Details of one or more implementations are set forth in the accompanying drawings and the description below. Other features, aspects, and potential advantages will be apparent from the description and drawings, and from the claims.

DESCRIPTION OF DRAWINGS

Like reference symbols in the various drawings indicate like elements.

DETAILED DESCRIPTION

Figure 1A:
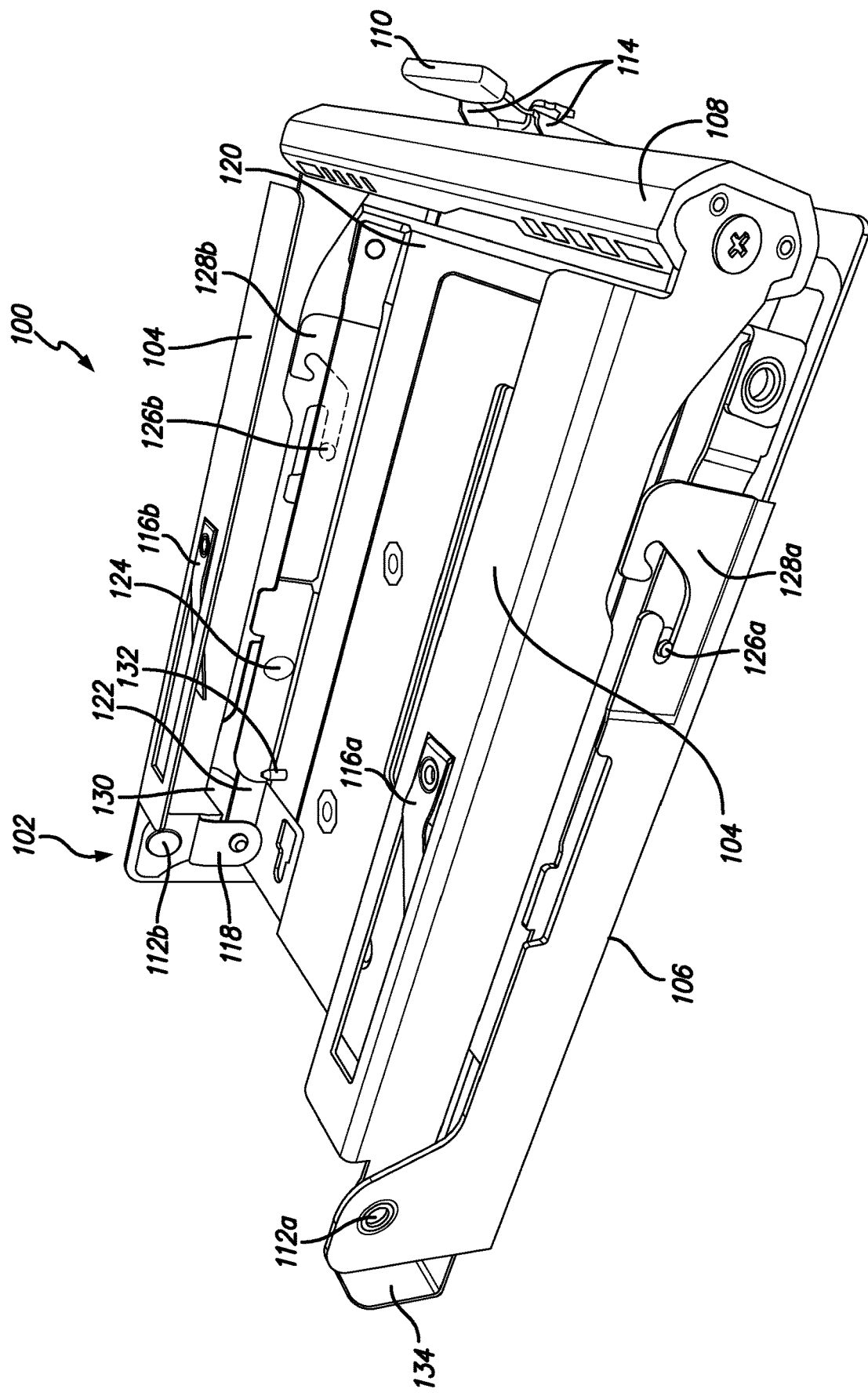
FIG. 1A is an isometric view of an embodiment of a hard drive carrier device in a closed position.

It will be appreciated that for simplicity and clarity of illustration, where appropriate, reference numerals have been repeated among the different figures to indicate corresponding or analogous elements. In addition, numerous specific details are set forth in order to provide a thorough understanding of the embodiments described herein. However, it will be understood by those of ordinary skill in the art that the embodiments described herein can be practiced without these specific details. In other instances, methods, procedures and members have not been described in detail so as not to obscure the related relevant feature being described. Also, the description is not to be considered as limiting the scope of the embodiments described herein. The drawings are not necessarily to scale and the proportions of certain parts have been exaggerated to better illustrate details and features of the present disclosure.

Several definitions that apply throughout this disclosure will now be presented.

The term "coupled" is defined as connected, whether directly or indirectly through intervening members, and is not necessarily limited to physical connections. The connection can be such that the objects are permanently connected or releasably connected. The term "substantially" is defined to be essentially conforming to the particular dimension, shape or other word that substantially modifies, such that the member need not be exact. For example, substantially cylindrical means that the object resembles a cylinder, but can have one or more deviations from a true cylinder. The term "comprising," when utilized, means "including, but not necessarily limited to"; it specifically indicates open-ended inclusion or membership in the so-described combination, group, series and the like.

Figure 1B:
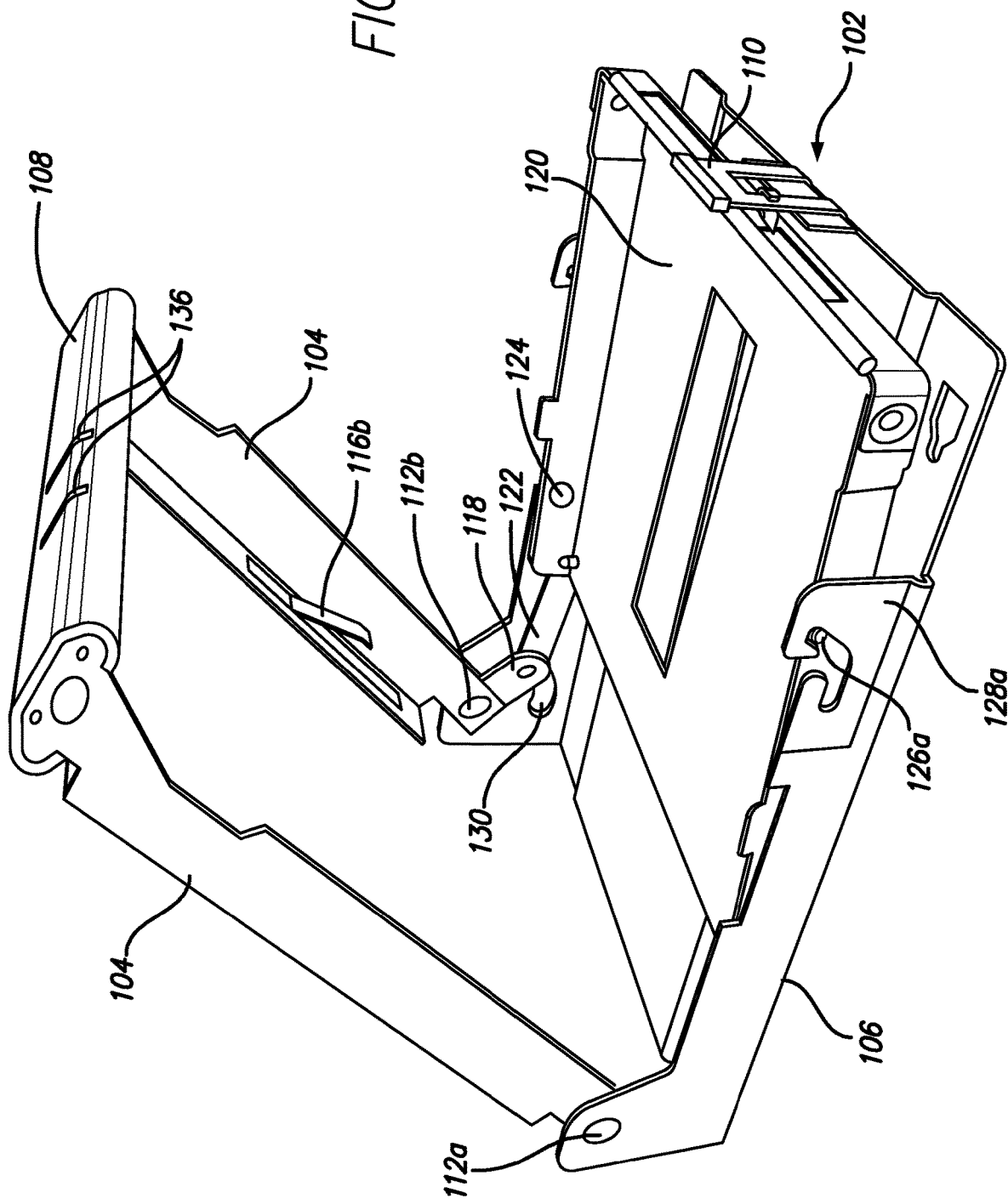
FIG. 1B is an alternate view of the device of FIG. 1A showing the hard drive carrier device in an open position.

FIGS. 1A and 1B illustrate an example hard drive carrier 100 for facilitating insertion and removal of a hard drive to/from a chassis (e.g. motherboard). In some implementations, hard drive carrier 100 can comprise frame 102 comprising lever 104, base 106, and base securing portion 120. Base securing portion 120 can be adapted to house and secure the hard drive inside frame 102. For example, a hard drive (not shown) can be inserted into frame 102 and housed in base securing portion 120 by lifting lever 104 into an open position (as shown in FIG. 1B) causing base securing portion 120 to tilt with respect to base 106.

Once the hard drive is inserted into base securing portion 120, rotating lever 104 down back into a closed position (as shown in FIG. 1A) causes base securing portion 120 to tilt back down to lie flat against base 106, securing the hard drive inside frame 102. In some implementations, rotating lever 104 down back into the closed position causes the hard drive to couple to the chassis. For example, lifting and lowering lever 104 can cause base securing portion 120 to slide horizontally and to tilt. Sliding horizontally causes the hard drive to couple and decouple from the chassis. Tilting aids in removal and insertion of the hard drive to/from base securing portion 120 of frame 102. In some implementations, the chassis can comprise hard drive couplings (e.g., SATA, IDE, SCSI, etc.) that couple to the hard drive. Conversely, the hard drive can be removed from carrier 100 in a similar manner by lifting lever 104 into the open position to cause base securing portion 120 to tilt, and removing the hard drive. In some implementations, lifting lever 104 into the open position causes the hard drive to decouple from the chassis. Frame 102 can be made of any material known in the art, including, but not limited to, plastic, metal, aluminum, alloys, wood, etc. The hard drive can be any hard disk drive (HDD) known in the art.

In some implementations, hard drive carrier 100 can be attached to the chassis. For example, base 106 of hard drive carrier 100 can be fixed to the chassis according to methods known in the art, including, but not limited to, screws, nails, friction fit, etc.

In some implementations, lever 104 can be pivotally coupled to base 106 to allow for opening and closing of lever 104. For example, lever 104 can be coupled to base 106 at pivot points 112a and 112b. Pivot points 112a and 112b can be any pivoting mechanism known in the art, including, but not limited to ball and socket joint, condyloid joint (ellipsoid), saddle joint, hinge joint, pivot joint, etc. In some implementations, pivot points 112a and 112b can be frictionally fit to provide slight resistance against lever 104 throughout its motion such that lever 104 can remain in place at any point between being opened and closed without any other support. By having lever 104 remain in place without any other support, it allows a user to insert a hard drive into frame 102 using only one hand, without having to simultaneously hold lever 104 in the open position.

In some implementations, base securing portion 120 can be caused to tilt by using rotational point 118, bar 122, tilting point 124, tilting tabs 126a and 126b, and sliding apertures 128a and 128b. For example, pivot point 112b can comprise rotational point 118 located on base 106. Rotational point 118 can be coupled to bar 122, and bar 122 can be coupled to tilting point 124 located on base securing portion 120. Tilting tabs 126a and 126b can be located on base securing portion 120 and can be adapted to slide along sliding apertures 128a and 128b located on base 106. As lever 104 is opened, rotational point 118 exerts a rotationally horizontal force on bar 122, which in turn exerts a rotationally horizontal force on tilting point 124 to cause base securing portion 120 to move horizontally as tilting tabs 126a and 126b slide along sliding apertures 128a and 128b causing base securing portion 120 to tilt.

In some implementations, base securing portion 120 slides horizontally according to how sliding apertures 128a and 128b are shaped. For example, sliding apertures 128a and 128b can be shaped with a horizontal portion leading into an inclined portion (as shown in FIGS. 1A and 1B) to cause base securing portion 120 to tilt upwards while simultaneously moving horizontally.

In some implementations, sliding apertures 128a and 128b can be shaped to limit how far base securing portion 120 tilts to prevent base securing portion 120 from tilting beyond a desired angle. For example, the desired angle can be 25 degrees, but can be any other value between 0 degrees and 90 degrees to allow for insertion or removal of the hard drive.

In some implementations, tilting tabs 126a and 126b can be any mechanical tabs known in the art adapted for sliding along an aperture, including, but not limited to, metal, plastic, etc. For example, tilting tabs 126a and 126b can comprise a raised portion for slidably coupling to sliding apertures 128a and 128b. In some implementations, tilting tabs 126a and 126b can comprise rollers, wheels, etc. to facilitate movement along sliding apertures 128a and 128b.

In some implementations, rotational point 118 is adapted to rotate along rotational aperture 130. For example, as lever 104 is lifted into the open position from the closed position, rotational point 118 rotates along rotational aperture 130 in an arc-shaped path. Rotational aperture 130 ensures that rotational point 118 moves in a consistent manner to cause consistent force to be applied to bar 122 to cause base securing portion 120 to tilt and to return to lie flat against base 106. In some implementations, rotational aperture 130 limits how far rotational point 118 can rotate to prevent lever 104 from opening beyond a desired range. For example, the desired range can be anywhere between 0 degrees and 90 degrees.

In some implementations, lever 104 can comprise handle 108. Handle 108 can be used to lift and lower lever 104 to/from the closed position and the open position. In some implementations, base 106 can comprise latch 110. Latch 110 can be adapted to engage with handle 108 to secure lever 104 in the closed position. For example, latch 110 can comprise securing prongs 114 that engage with handle 108 to secure lever 104 in place in the closed position. In some implementations, handle 108 can comprise securing apertures 136 adapted to engage with securing prongs 114. Pulling on latch 110 causes securing prongs 114 to disengage from securing apertures 136 of handle 108 to allow lever 104 to be lifted into the open position. In some implementations, latch 110 is spring loaded such that it returns back to its original position after being engaged or disengaged to/from handle 108.

In some implementations, lever 104 comprises springs 116a and 116b for facilitating opening of carrier 100 when frame 102 is housing the hard drive. For example, when frame 102 is not housing the hard drive, springs 116a and 116b are not compressed. When the hard drive is housed within frame 102 in the closed position, springs 116a and 116b become compressed and resist against the hard drive, thereby securing the hard drive within frame 102 without the need for fastening mechanisms, such as screws, snap fittings, or other fastening means. In some implementations, springs 116a and 116b prevent vertical movement of the hard drive. Once latch 110 is disengaged from handle 108, the compressed force from springs 116a and 116b against the hard drive causes lever 104 to automatically pop up without having to lift lever 104. Springs 116a and 116b can be any spring known in the art, including, but not limited to, tension/extension, compression, coil, flat, cantilever, etc. In some implementations, springs 116a and 116b can be used to secure the hard drive inside frame 102. For example, because springs 116a and 116b resist against the hard drive when lever 104 is in the closed position, it helps to secure the hard drive in place.

In some implementations, springs 116a and 116b can be coupled to lever 104 and base 106 such that springs 116a and 116b are compressed and resist against lever 104 while lever 104 is in the closed position. Once latch 110 is disengaged from handle 108, the compressed force from springs 116a and 116b against lever 104 causes lever 104 to automatically pop up into the open position, while simultaneously causing base securing portion 120 to slide forward and tilt.

In some implementations, base securing portion 120 can comprise at least one securing pin 132. For example, securing pin 132 can be adapted to engage the hard drive to help secure the hard drive on base securing portion 120. In some implementations, the combination of springs 116a and 116b with securing pin 132 secure the hard drive in frame 102 to allow quick insertion and removal of hard drive without using any tools. Securing pin 132 can be made of any material known in the art, including, but not limited to, metal, alloys, plastic, etc. Securing pin 132 can be located at the rear of base securing portion 120, near rotational joint 118. Securing pin 132 can be located such that it aligns with a screw hole of the hard drive to prevent lateral movement.

In some implementations, base 106 can comprise limiting portion 134 for limiting how far back the hard drive slides into frame 102. For example, limiting portion 134 can comprise an "L" shaped extension at the rear of frame 102 that protrudes outwardly from base 106. The distance limiting portion 134 protrudes determines how far into frame 102 the hard drive can slide. In some implementations, limiting portion 134 can be adapted to be adjustable such that hard drives of various lengths can be accommodated in frame 102. Limiting portion 134 can also act as an additional securing means for holding the hard drive in place in frame 102.

In some implementations, frame 102 can be adapted to couple to a chassis comprising hard drive couplings (e.g., SATA, IDE, SCSI, etc.). For example, once the hard drive is inserted into frame 102, frame 102 can be inserted into the chassis to couple the hard drive to the hard drive couplings in the chassis. Alternatively, frame 102 can be fixed in the chassis, and the hard drive can be inserted into the frame. Closing frame 102 into a closed position (as shown in FIG. 1A) causes the hard drive to couple to the hard drive couplings located on the chassis. For example, closing frame 102 can comprise pivoting lever 104 from a position perpendicular (or non-parallel) to base 106, to a position parallel (or near parallel) to base 106. Opening frame 102 into an open position (as shown in FIG. 1B) causes the hard drive to decouple from the hard drive couplings to allow for removal of the hard drive. For example, opening frame 102 can comprise pivoting lever 104 from a position parallel (or near parallel) to base 106, to a position perpendicular (or non-parallel) to base 106.

In some implementations, a plurality of frames 102 can be configured side-by-side in a server blade to house a plurality of hard drives in the server blade. Each frame 102 can comprise lever 104, base 106, and base securing portion 120 for securing a hard drive. This allows for insertion and removal of multiple hard drives at a time.

Figure 2A:
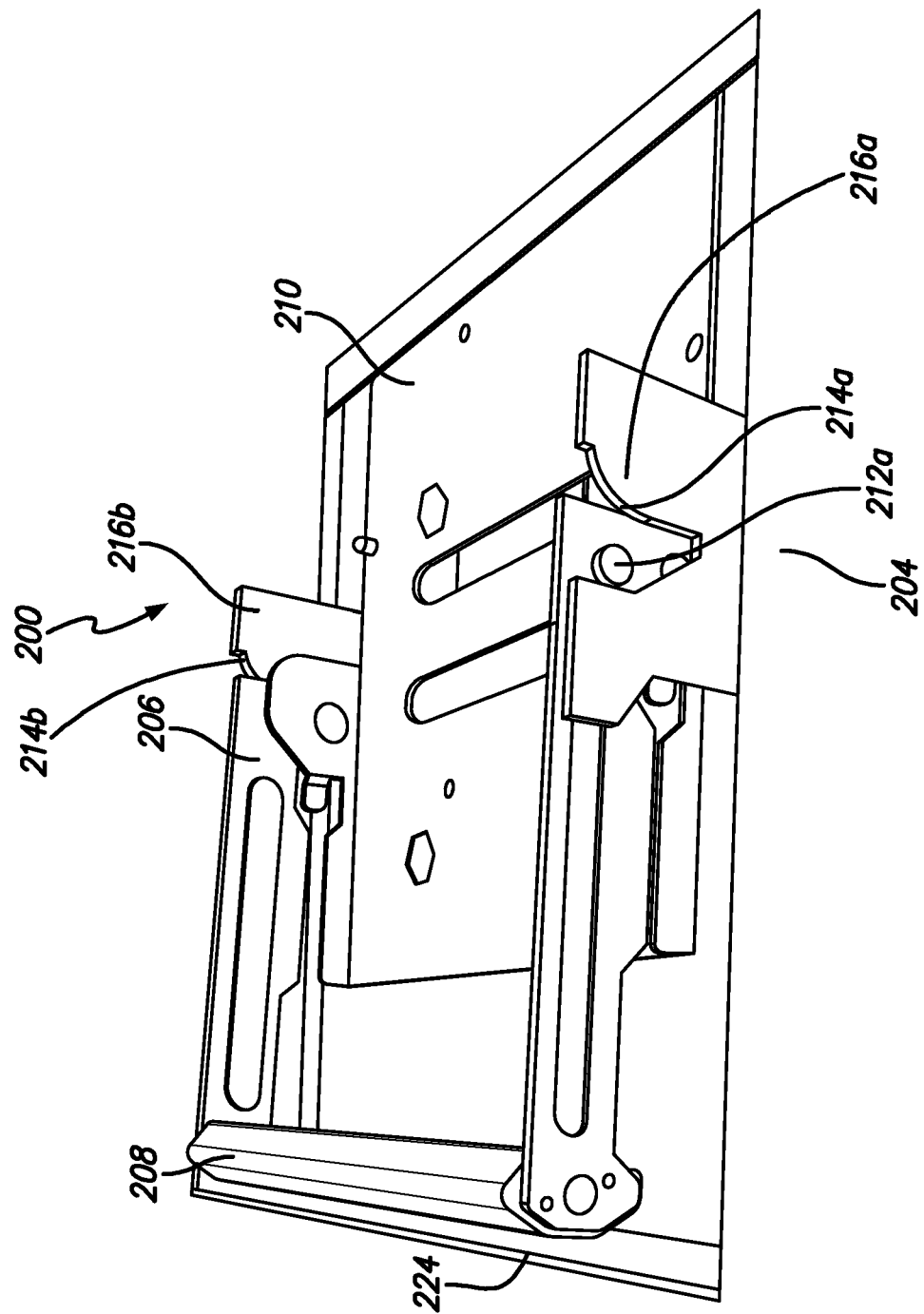
FIG. 2A is an isometric view of another embodiment of a hard drive carrier device in a closed position.
Figure 2B:
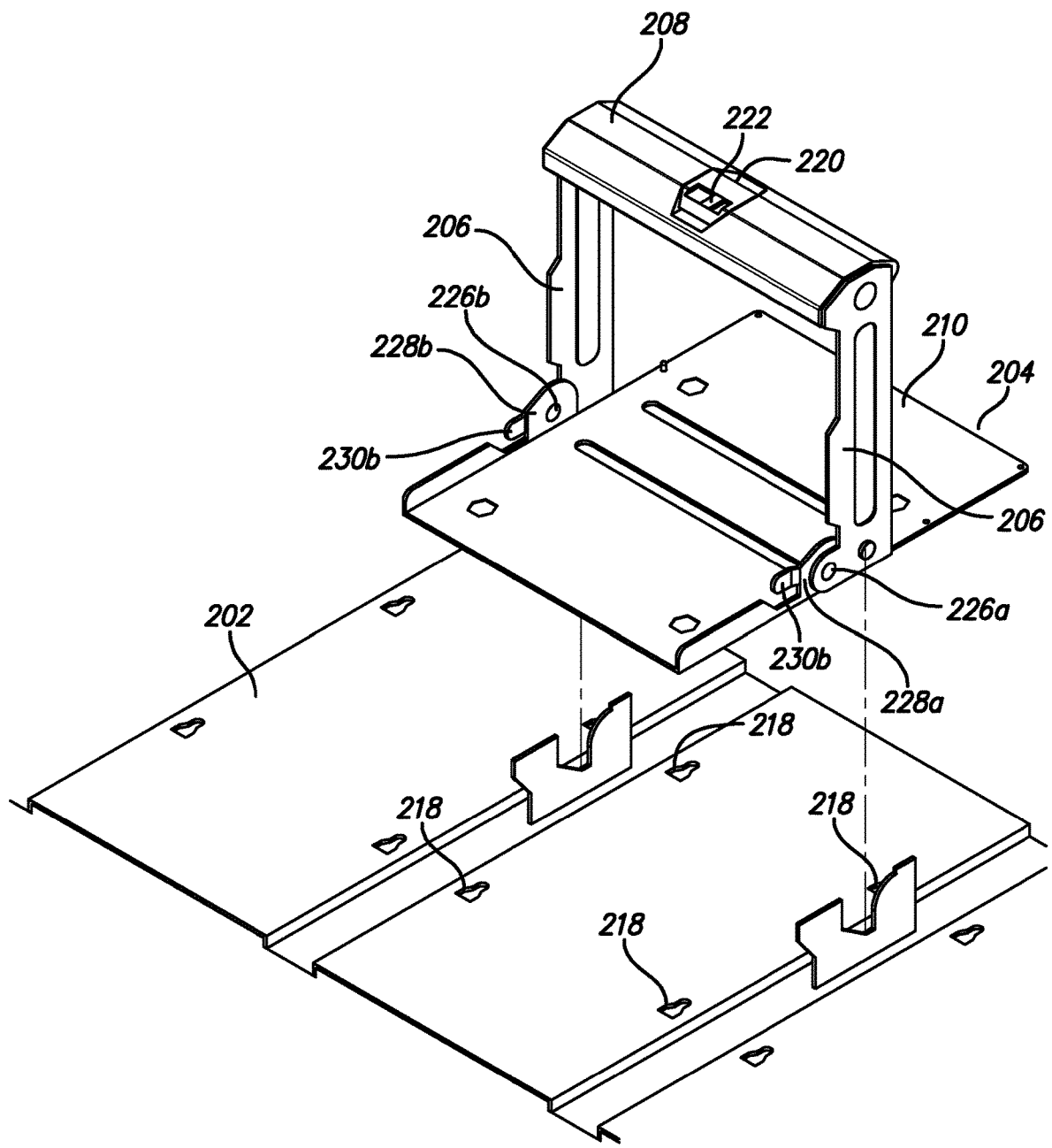
FIG. 2B is an alternate view of the device of FIG. 2A showing a removable portion of the hard drive carrier device removed from a frame.
Figure 2C:
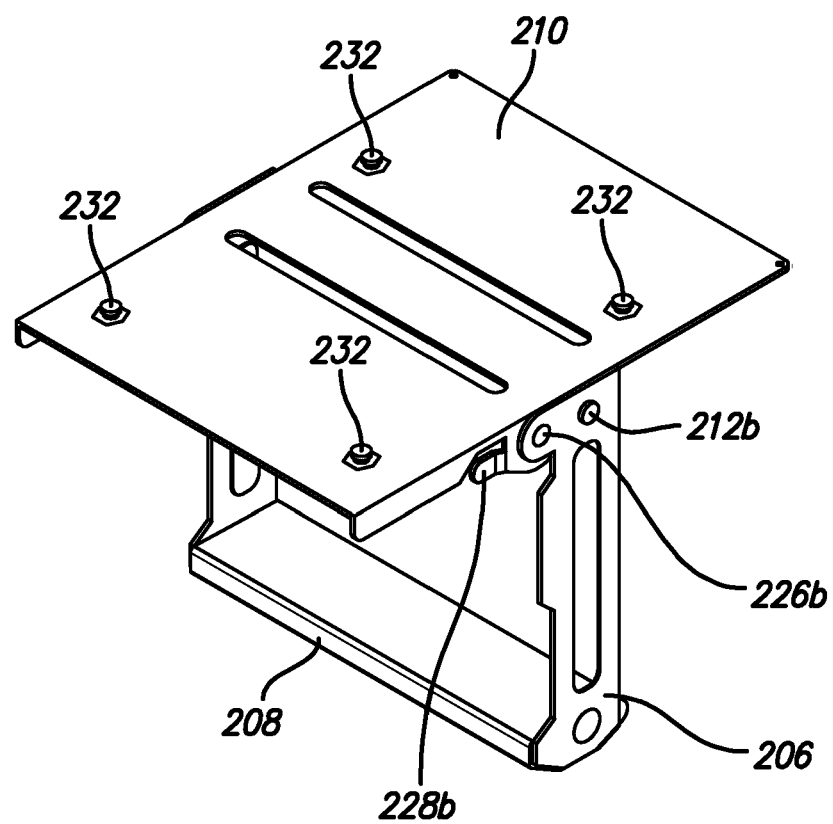
FIG. 2C is an upside down view of the device of FIG. 2B showing the underside of the removable portion.

FIGS. 2A-2C illustrate an alternate hard drive carrier 200 that is adapted to be removable from base 202 while housing a hard drive (not shown) according to embodiments of the invention. For example, hard drive carrier 200 can be removable from a chassis (e.g., motherboard), and is not fixed in place on the chassis through fastening means, such as screws, nails, friction fittings, etc. In some implementations, carrier 200 comprises removable frame 204 comprising lever 206, handle 208, and floor 210. For example, removable frame 204 can be secured to base 202 when lever 206 is in a closed position (as shown in FIG. 2A) and can be removed from base 202 when lever 206 is in an open position (as shown in FIG. 2B). In some implementations, lever 206 is parallel (or near parallel) to floor 210 in the closed position. In other implementations, lever 206 is perpendicular (or non-parallel) to floor 210 in the open position. Removable frame 204 can be made of any material known in the art, including, but not limited to, plastic, metal, aluminum, alloys, wood, etc. The hard drive can be any hard disk drive (HDD) known in the art. In some implementations, floor 210 can be adapted to house the hard drive. For example, the hard drive can be removably secured to floor 210 according to securing means known in the art, including, but not limited to, screws, friction fittings, snap fittings, etc.

In some implementations, the hard drive is coupled to hard drive couplings (e.g., SATA, IDE, SCSI, etc.) located on a chassis (e.g. motherboard) when lever 206 is in the closed position. For example, carrier 200 can be adapted to slide into place on the chassis when lever 206 is in the closed position, causing the hard drive to couple to the hard drive couplings. In some implementations, the hard drive is decoupled from the hard drive couplings when lever 206 is in the open position. For example, carrier 200 can be adapted to slide out of place on the chassis when lever 206 is in the open position, causing the hard drive to decouple from the hard drive couplings and allowing carrier 200 to be removed from the chassis along with the hard drive.

In some implementations, removable frame 204 can be adapted to slide to lock/unlock into/out of place on base 202. For example, lever 206 can comprise sliding tabs 212a and 212b and base 202 can comprise tracks 214a and 214b adapted to receive sliding tabs 212a and 212b. Tracks 214a and 214b can also be spaced apart such that they are the same width as floor 210, to act as guides for inserting removable frame 204 onto base 202. In some implementations, tracks 214a and 214b can comprise engagement flanges 216a and 216b adapted to engage with sliding tabs 212a and 212b. For example, engagement flanges 216a and 216b can be shaped such that moving lever 206 in an upward direction will cause sliding tabs 212a and 212b to engage with engagement flanges 216a and 216b to cause floor to slide in a forward direction, and moving lever 206 in a downward direction will cause sliding tabs 212a and 212b to engage with engagement flanges 216a and 216b to cause floor to slide in a rearward direction. In some implementations, engagement flanges 216a and 216b can be contoured portions grooved into tracks 214a and 214b respectively (as shown in FIG. 2A).

In some implementations, floor 210 can comprise a plurality of securing tabs 232 (FIG. 2C) adapted to slidably couple to a plurality of securing apertures 218 (FIG. 2B) located on base 202. For example, securing apertures 218 and securing tabs 232 can be any slidable securing means known in the art, including, but not limited to, friction fit, snap fit, etc. In some implementations, base 202 can be a part of the chassis, such as the chassis floor. In some implementations, securing apertures 218 can comprise tapered portions (as shown in FIG. 2B) configured to facilitate engagement with securing tabs 232. For example, securing tabs 232 can comprise protrusions from the underside of floor 210. The protrusions can be adapted to fit snuggly into the tapered portions of securing apertures 218 to secure floor 210 in place when lever 206 is in the closed position. When lever 206 is lifted into the open position, the protrusions disengage from the tapered portions to allow carrier 200 to be removed from the chassis.

In some implementations, lever 208 can be pivotally coupled to floor 210 at pivot points 226a and 226b facilitate pivoting of lever 208. For example, floor 210 can comprise attachment flanges 228a and 228b. Lever 208 can be coupled to pivot points 226a and 226b through attachment flanges 228a and 228b such that lever 208 can be pivoted relative to floor 210 at pivot points 226a and 226b. Pivot points 226a and 226b can be any pivoting mechanism known in the art, including, but not limited to ball and socket joint, condyloid joint (ellipsoid), saddle joint, hinge joint, pivot joint, etc. In some implementations, pivot points 226*a* and 226*b* can be frictionally fit such that lever 208 remains in place in the open position. This facilitates removal of removable frame 204 from base 202 while housing the hard drive.

In some implementations, a latch (not shown) can be used to secure removable frame 204 in place when lever 206 is in the closed position. For example, the latch can be adapted to couple with handle 208 according to means disclosed above. The latch can be substantially similar to latch 110 as shown in FIGS. 1A and 1B. Alternatively, handle 208 can comprise button 220 for securing removable frame 204 in place. For example, button 220 can comprise securing apertures 222 adapted to couple to prongs (not shown) located on wall 224 of base 202. The prongs can be similar to prongs 114 in FIG. 1B, and can be any prongs known in the art for coupling to securing apertures 222 including, but not limited to, hooks, pins, etc. In some implementations, button 220 can be disengaged from the prongs by pressing on button 220 and lifting handle 208. For example, pressing on button 220 causes securing apertures 222 to disengage from the prongs, to allow lever 206 to be moved by pulling on handle 208. Button 220 can be any mechanical button known in the art for securing purposes.

In some implementations, lever 206 can be coupled to at least one spring (not shown) such that the spring facilitates opening of lever 206 from the closed position to the open position. For example, the spring can be compressed against lever 206 while lever 206 is in the closed position. While in the closed position, lever 206 can be engaged with the latch or the prongs to prevent lever 206 from opening. Once lever 206 is disengaged from the latch or the prongs, the compressed force causes lever 206 to rotate from the closed position to the open position. The spring can be any spring known in the art, including, but not limited to, tension/extension, compression, coil, flat, cantilever, etc.

In some implementations, attachment flanges 228*a* and 228*b* can comprise stoppers 230*a* and 230*b*. For example, stoppers 230*a* and 230*b* can be protrusions extending parallel to floor 210. Stoppers 230*a* and 230*b* can be adapted to engage with lever 206 in the closed position, preventing lever 206 from rotating past a certain point. In some implementations, lever 206 is stopped by stopper 230*a* and 230*b* when lever 206 is parallel to floor 210.

In some implementations, a plurality of carriers can be housed in the chassis, each carrier adapted to be removable from the chassis while housing a hard drive. For example, carrier 200 can be one of a plurality of carriers housed on the chassis. In some implementations, carrier 200 can be adapted to tilt while being removed from the chassis according to the above disclosure.

In some implementations, lever 206 can be adapted to cause floor 210 to tilt to facilitate insertion and removal of a hard drive to/from a chassis. For example, rotating lever 206 from the closed position to the open position causes floor 210 to slide and decouple the hard drive from the chassis. Lever 206 can be adapted to stop rotating once lever 206 is in the open position. Therefore, once in the open position, continuing to rotate lever 206 further causes floor 210 to tilt with respect to the chassis to allow for removal and/or insertion of a hard drive.

Figure 3:
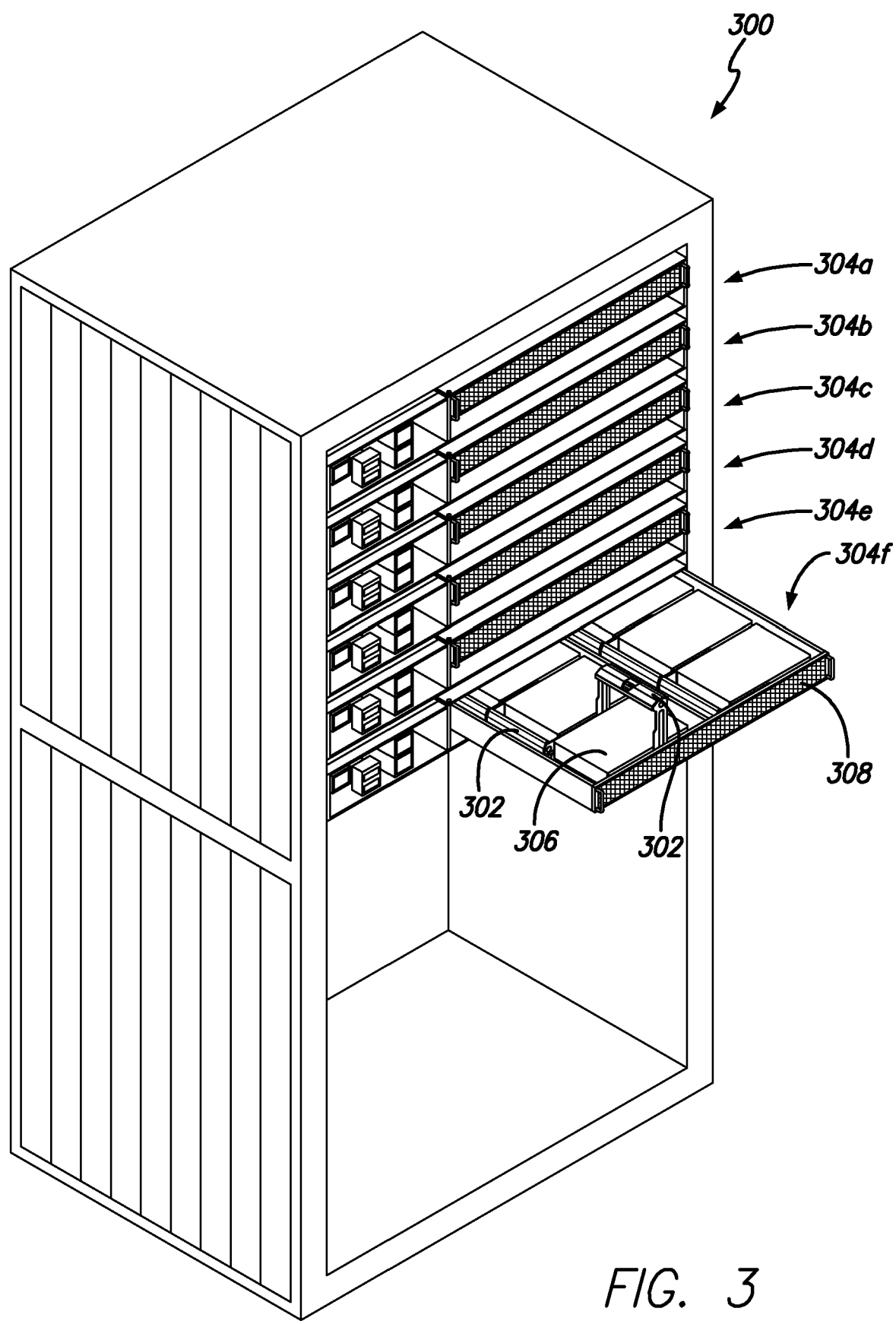
FIG. 3 is an isometric view of a server tower comprising a plurality of hard drive carriers housed in a chassis.

FIG. 3 illustrates server tower 300 comprising a plurality of hard drive carriers 302 housed in chassis 304. In some implementations, server tower 300 can comprise a plurality of chasses 304, each chassis 304 adapted to house a plurality of hard drive carriers 302. For example, hard drive carriers 302 can be any hard drive carrier described above in this disclosure. Chassis 304 can comprise a motherboard.

In some implementations, chassis 304 can be adapted to slide out from server tower 300 to allow for access to hard drive carriers 302. For example, hard drive carriers 302 can each house hard drive 306. Hard drives 306 can be coupled and decoupled to/from chassis 304 using hard drive carrier 302. In some implementations, hard drives 306 can be accessed from the top of chassis 304. For example, hard drive carrier 302 can be adapted to be removable from chassis 304 while housing hard drive 306. In some implementations, hard drive carrier 302 can be lifted out of chassis 304 from the top of chassis 304. For example, chassis 304 can comprise an open top design to allow for quick access to hard drives 306 housed in hard drive carriers 302. Hard drive carriers 302 can be removably coupled to chassis 304 to allow for quick removal, according to the teachings in the above disclosure.

In some implementations hard drives 306 can be removably attached to hard drive carriers 302. For example, hard drives 306 can be removably fixed to hard drive carriers 302 using screws, friction fittings, snap fittings, etc.

In some implementations, chassis 304 can be slidably coupled to server tower 300 according to methods well known in the art. For example, chassis 304 can be configured such that subportion 308 slides out. Subportion 308 can be adapted to house hard drive carriers 302. Subportion 308 can be adapted to slide out completely to allow quick topside access to hard drives 306 and hard drive carriers 302.

A number of implementations have been described. Nevertheless, it will be understood that various modifications may be made. For example, other steps may be provided, or steps may be eliminated, from the described methods, and other components may be added to, or removed from, the described systems. Accordingly, other implementations are within the scope of the following claims.

For clarity and simplicity, only one hard drive carrier 100, 200 is described. However, multiple hard drive carriers housing multiple hard drives can be supported by the above disclosure. For example, multiple hard drive carriers housing multiples hard drives can be located side-by-side according to the disclosure herein.

Although a variety of examples and other information were used to explain aspects within the scope of the appended claims, no limitation of the claims should be implied based on particular features or arrangements in such examples, as one of ordinary skill would be able to use these examples to derive a wide variety of implementations. Further and although some subject matter may have been described in language specific to examples of structural features and/or method steps, it is to be understood that the subject matter defined in the appended claims is not necessarily limited to these described features or acts. For example, such functionality can be distributed differently or performed in components other than those identified herein. Rather, the described features and steps are disclosed as examples of components of systems and methods within the scope of the appended claims.

What is claimed is:

1. A device comprising:
    a frame comprising a lever pivotally coupled to a base, the lever comprising a handle, and the base comprising a latch;
    the latch adapted to secure the handle in place when the lever is in a closed position; and
    the base coupled to a base securing portion, the base securing portion adapted to house a hard drive and lie flat when the lever is in the closed position, and further adapted to tilt to facilitate insertion or removal of the hard drive when the lever is in an open position, the base securing portion adapted to tilt or lie flat according to opening or closing of the lever, wherein the lever is pivotally coupled to the base through at least one joint, wherein the base further comprises at least one track and the base securing portion comprises at least one track tab, the at least one track engaging with the at least one track tab to cause the base securing portion to tilt when the lever is pivotally rotated from the closed position to the open position.

2. The device of claim 1 wherein the base securing portion comprises at least one securing pin for holding the hard drive in place.

3. The device of claim 1 wherein the lever further comprises at least one securing point for holding the hard drive in place.

4. The device of claim 3 wherein the at least one securing point is a spring, wherein the spring causes the lever to pop up when the latch is disengaged from the handle.

5. The device of claim 1 wherein the base securing portion comprises a stopper for facilitating insertion and securement of the hard drive in place.

6. A device comprising:

a frame comprising a lever pivotally coupled to a base through at least one joint, the lever comprising a handle, and the base comprising a latch;

the latch adapted to secure the handle in place when the lever is in a closed position;

the base coupled to a base securing portion, the base securing portion adapted to house a hard drive and lie flat when the lever is in the closed position, and further adapted to tilt to facilitate insertion or removal of the hard drive when the lever is in an open position, the base securing portion adapted to tilt or lie flat according to opening or closing of the lever; and the base further comprising at least one track and the base securing portion comprising at least one track tab, the at least one track engaging with the at least one track tab to cause the base securing portion to tilt when the lever is pivotally rotated from the closed position to the open position.

7. The device of claim 6 wherein the lever is coupled to the base securing portion.

8. The device of claim 6 wherein the track comprises a groove.

* * * * *